(12) United States Patent
Machkaoutsan et al.

(10) Patent No.: US 9,136,180 B2
(45) Date of Patent: Sep. 15, 2015

(54) PROCESS FOR DEPOSITING ELECTRODE WITH HIGH EFFECTIVE WORK FUNCTION

(75) Inventors: Vladimir Machkaoutsan, Leuven (BE); Jan Willem Maes, Wilrijk (BE); Qi Xie, Almere (NL)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 13/359,385

(22) Filed: Jan. 26, 2012

(65) Prior Publication Data
US 2012/0309181 A1 Dec. 6, 2012

Related U.S. Application Data

(60) Provisional application No. 61/492,207, filed on Jun. 1, 2011.

(51) Int. Cl.
| | |
|---|---|
| H01L 21/8238 | (2006.01) |
| H01L 21/28 | (2006.01) |
| H01L 29/49 | (2006.01) |
| H01L 29/66 | (2006.01) |
| H01L 29/78 | (2006.01) |

(52) U.S. Cl.
CPC .. *H01L 21/823842* (2013.01); *H01L 21/28088* (2013.01); *H01L 29/4966* (2013.01); *H01L 29/66545* (2013.01); *H01L 29/7833* (2013.01)

(58) Field of Classification Search
USPC .......................................................... 438/585
See application file for complete search history.

(56) References Cited

U.S. PATENT DOCUMENTS

| | | | |
|---|---|---|---|
| 6,040,021 A | 3/2000 | Miyamoto | |
| 6,089,184 A | 7/2000 | Kaizuka et al. | |
| 6,268,288 B1 | 7/2001 | Hautala et al. | |
| 6,420,236 B1* | 7/2002 | Hu et al. | 438/291 |
| 6,436,819 B1 | 8/2002 | Zhang et al. | |
| 6,555,183 B2 | 4/2003 | Wang et al. | |
| 6,756,318 B2 | 6/2004 | Nguyen et al. | |
| 6,803,266 B2* | 10/2004 | Solomon et al. | 438/197 |
| 6,858,524 B2 | 2/2005 | Haukka et al. | |
| 7,045,406 B2 | 5/2006 | Huotari et al. | |
| 7,235,484 B2 | 6/2007 | Nguyen et al. | |

(Continued)

OTHER PUBLICATIONS

Hinkle et al., "Band-Edge Effective Work Functions by Controlling HfO$_2$/TiN Interfacial Composition for Gate-Last CMOS", *ECS Transactions*, vol. 35(2), pp. 285-295 (2011).

*Primary Examiner* — Charles Garber
*Assistant Examiner* — Brigitte Paterson
(74) *Attorney, Agent, or Firm* — Knobbe, Martens, Olson & Bear, LLP

(57) ABSTRACT

According to some embodiments, an electrode have a high effective work function is formed. The electrode may be the gate electrode of a transistor and may be formed on a high-k gate dielectric by depositing a first layer of conductive material, exposing that first layer to a hydrogen-containing gas, and depositing a second layer of conductive material over the first layer. The first layer may be deposited using a non-plasma process in which the substrate is not exposed to plasma or plasma-generated radicals. The hydrogen-containing gas to which the first layer is exposed may include an excited hydrogen species, which may be part of a hydrogen-containing plasma, and may be hydrogen-containing radicals. The first layer may also be exposed to oxygen before depositing the second layer. The work function of the gate electrode in the gate stack may be about 5 eV or higher in some embodiments.

38 Claims, 13 Drawing Sheets

(56) References Cited

U.S. PATENT DOCUMENTS

| | | |
|---|---|---|
| 7,582,521 B2 | 9/2009 | Alshareef et al. |
| 7,713,592 B2 | 5/2010 | Nguyen et al. |
| 2007/0134932 A1* | 6/2007 | Seo et al. .................. 438/758 |
| 2007/0251451 A1 | 11/2007 | Nguyen et al. |
| 2008/0142893 A1* | 6/2008 | Hung et al. ................. 257/368 |
| 2008/0182411 A1* | 7/2008 | Elers ........................... 438/685 |
| 2010/0033670 A1* | 2/2010 | Fujita et al. ................. 349/158 |
| 2010/0111781 A1* | 5/2010 | Takahashi et al. ........ 422/186.21 |
| 2010/0117136 A1* | 5/2010 | Yasuda ....................... 257/321 |
| 2010/0127335 A1* | 5/2010 | Niimi et al. ................. 257/368 |
| 2010/0190353 A1 | 7/2010 | Nguyen et al. |
| 2010/0285237 A1 | 11/2010 | Ditizio et al. |
| 2011/0183508 A1* | 7/2011 | Chan et al. .................. 438/591 |
| 2011/0198699 A1* | 8/2011 | Hung et al. .................. 257/369 |
| 2012/0225545 A1* | 9/2012 | Fu et al. ..................... 438/585 |

* cited by examiner

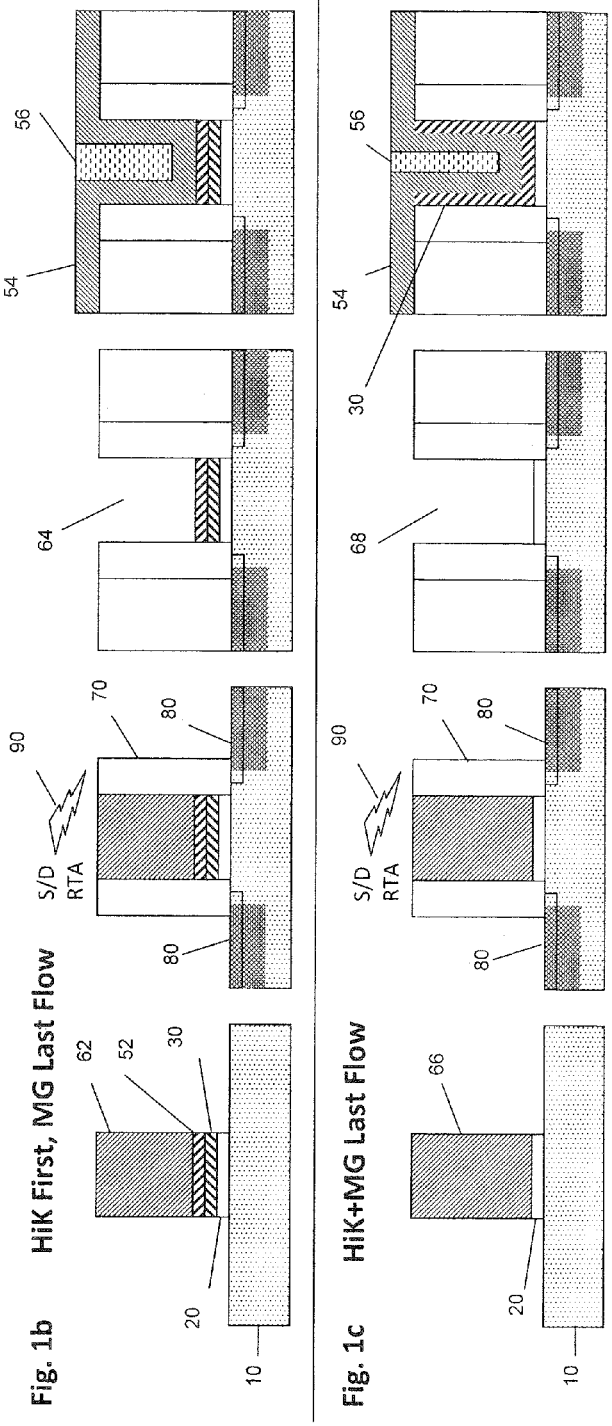
Fig. 1a  HiK+MG First Flow
Fig. 1b  HiK First, MG Last Flow
Fig. 1c  HiK+MG Last Flow

Fig. 2

| | First TiN layer | Air Break | Treatment with reducing ambient | Air Break | Second TiN layer | EOT, nm | EWF, eV |
|---|---|---|---|---|---|---|---|
| 1A | - | - | - | - | 10 nm ALD TiN 390C | 0.92 | 4.74 |
| 1B | 2 nm ALD TiN 390C | Y | 1 nm PEALD TaCN (325C 3.5s, 32 cycles) | Y | 10 nm ALD TiN 390C | 1.28 | 5.04 |
| 1C | 2 nm ALD TiN 390C | Y | 1 nm PEALD TaCN (325C 2 s, 32 cycles) | Y | 10 nm ALD TiN 390C | 1.18 | 4.98 |
| 1D | 2 nm ALD TiN 390C | Y | 1 nm ALD TaCN 325C | Y | 10 nm ALD TiN 390C | 0.94 | 4.76 |
| 1E | 2 nm ALD TiN 390C | Y | 1 nm ALD TaCN 325C + Ar/H2-plasma (325C, 2 s, 32 cycles) | Y | 10 nm ALD TiN 390C | 1.08 | 4.88 |
| 1F | 2 nm ALD TiN 390C | Y | Ar/H2-plasma (325C, 2 s, 32 cycles) | Y | 10 nm ALD TiN 390C | 1.11 | 4.96 |
| 1G | 2 nm ALD TiN 390C | Y | - | Y | 10 nm ALD TiN 390C | 1.03 | 4.75 |

Fig. 4

| | First TiN layer | Air Break | Treatment with reducing ambient | Air Break | Second TiN layer | EOT, nm | EWF, eV |
|---|---|---|---|---|---|---|---|
| 2A | - | - | - | - | 10 nm ALD TiN 390C | 0.95 | 4.70 |
| 2B | 2 nm ALD TiN 390C | Y | Ar/H2-plasma 325C | Y | 10 nm ALD TiN 390C | 1.09 | 4.85 |
| 2C | 2 nm ALD TiN 390C | Y | Ar/H2-plasma 390C | Y | 10 nm ALD TiN 390C | 1.06 | 4.86 |
| 2D | 2 nm ALD TiN 390C | N | Ar/H2-plasma 390C | N | 10 nm ALD TiN 390C | 1.02 | 4.80 |
| 2E | - | - | - | - | 10 nm ALD TiN 325C | 0.99 | 4.66 |
| 2F | 2 nm ALD TiN 325C | Y | Ar/H2-plasma 325C | Y | 10 nm ALD TiN 325C | 1.15 | 4.84 |
| 2G | 2 nm ALD TiN 325C | Y | Ar/H2-plasma 325C | N | 10 nm ALD TiN 325C | 1.14 | 4.78 |
| 2H | 2 nm ALD TiN 325C | N | Ar/H2-plasma 325C | Y | 10 nm ALD TiN 325C | 1.13 | 4.77 |
| 2I | 2 nm ALD TiN 325C | N | Ar/H2-plasma 325C | N | 10 nm ALD TiN 325C | 1.14 | 4.76 |

Fig. 6

| | Susceptor Temperature, C | Reactor pressure, Torr | Precursors | Pulsing sequence | Plasma power, W | Plasma on time, s |
|---|---|---|---|---|---|---|
| ALD TiN | 325 or 390 | 0.5 | TiCl4, NH3 | 1. TiCl4 pulse<br>2. Purge<br>3. NH3 pulse<br>4. Purge | - | |
| PEALD TaCN | 325 | 1.5 | TBTDET, Ar/H2 plasma | 1. TBTDET pulse<br>2. Purge<br>3. Ar/H2 plasma<br>4. Purge | 175 | 2 or 3.5 |
| ALD TaCN | 325 | 4.0 | TBTDET, NH3 | 1. TBTDET pulse<br>2. Purge<br>3. NH3 pulse<br>4. Purge | - | |
| Ar/H2 plasma treatment | 325 or 390 | 1.5 | Ar/H2 plasma | 1. Ar/H2 plasma<br>2. Purge | 175 | 2 |

PROCESS FOR DEPOSITING ELECTRODE WITH HIGH EFFECTIVE WORK FUNCTION

PRIORITY APPLICATION

This disclosure claims the benefit under 35 U.S.C. §119(e) of U.S. Provisional Patent Application No. 61/492,207, filed Jun. 1, 2011, entitled "PROCESS FOR DEPOSITING ELECTRODE WITH HIGH EFFECTIVE WORK FUNCTION," and assigned to the assignee hereof. The disclosure of the prior application is incorporated by reference herein in its entirety.

TECHNICAL FIELD

This disclosure relates to the field of semiconductor processing and, more particularly, to the deposition of conductive structures, such as metal gate electrodes, including metal gate electrodes in gate stacks in transistors.

DESCRIPTION OF THE RELATED ART

Due to continual demands for increased computing power and decreased integrated circuit sizes, there is also a continual demand to decrease the sizes of the electronic devices that form the integrated circuits. For example, the sizes of transistors continue to be reduced in order to, e.g., increase the density of the transistors in an integrated circuit, to increase computing power. As the transistors decrease in size, so do their constituent components, such as the gate dielectric layers that separate the gate electrodes of the transistors from the channel regions of the transistors. Thinner gate dielectric layers have typically required the use of higher dielectric constant (high-k) materials in order to prevent undesired current leakage across the gate dielectric layer. Transistors with these high-k materials, however, may have poor performance characteristics when the high-k materials are used with some traditional silicon-based gate electrode materials. Accordingly, there is a continuing need for conductive electrodes, such as conductive gate electrodes, suitable for use with high-k gate dielectric materials in electronic devices such as transistors.

SUMMARY

According to some embodiments, a process for semiconductor processing is provided. The process includes forming a gate electrode over a substrate. Forming the gate electrode includes providing the substrate in a reaction chamber, the substrate having a gate dielectric. A first layer including a transition metal compound is deposited on the gate dielectric without exposing the substrate to plasma or plasma-generated radicals during the deposition. The first layer is then exposed to a hydrogen-containing gas. Subsequently, a second layer including a transition metal compound is deposited.

According to some other embodiments, a process for semiconductor processing is provided. The process includes depositing a metallic electrode. Depositing the metallic electrode includes depositing metallic material on a gate dielectric. Precursors for depositing the metallic material are not plasma-activated. The metallic material is exposed to an excited hydrogen-containing species. Subsequently, additional metallic material is deposited on the metallic material after exposing the metallic material to the excited hydrogen-containing species.

BRIEF DESCRIPTION OF THE DRAWINGS

Non-limiting and non-exhaustive embodiments of the present invention are described with references to the following figures, wherein like reference numerals refer to like parts throughout.

FIGS. 1a-1c show examples of various process flows for forming metal gate electrodes.

FIG. 2 shows examples of various process sequences for depositing a conductive material.

FIG. 4 shows additional examples of process sequences for depositing a conductive material.

FIG. 6 shows some conditions for the process sequences of FIGS. 2 and 4.

DETAILED DESCRIPTION

Figure 3:
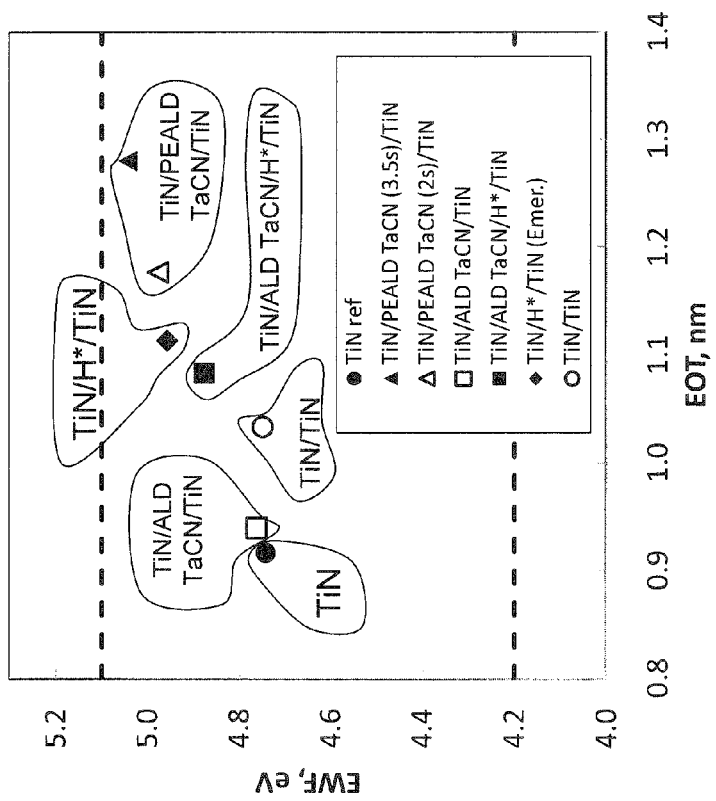
FIG. 3 is an example of a graphical presentation of the results of sequences shown in FIG. 2.

According to some embodiments, a conductive structure is formed on a substrate by depositing a first layer of conductive material, exposing that first layer to a hydrogen-containing gas (which includes hydrogen-containing species in a gas-like state), and depositing a second layer of conductive material over the first layer. In some embodiments, the conductive structure is formed on a dielectric layer. For example, the conductive structure may be a gate electrode formed on a gate dielectric, e.g., a high-k gate dielectric, as part of a transistor. The first layer may be deposited using a non-plasma or non-radical process in which the substrate is not exposed to plasma or plasma-generated radicals (that is, radicals that are generated by a plasma). That first layer is then exposed to a hydrogen-containing species. In some embodiments, the hydrogen-containing species may be excited hydrogen-containing species, which may be part of a hydrogen-containing plasma. In some embodiments, the hydrogen-containing species include hydrogen-containing radicals that can be generated in a remote plasma generator and then flowed into a reaction chamber containing the first layer.

Advantageously, where the conductive material is used to form a metal gate in a transistor, the work function of the gate electrode in the gate stack may be about 4.85 eV or higher, or about 5 eV or higher. In some embodiments, the thickness of the first layer is less than about 5 nm, less than about 4 nm, less than about 3 nm, or about 1-3 nm. Preferably, the first layer is thicker than a monolayer of the material forming it.

In some embodiments, in addition to forming the first layer by a non-plasma process, the second layer may also be formed by a non-plasma process in which the substrate is not exposed to plasma or plasma-generated radicals. In some other embodiments, the second layer is formed by exposure to plasma or radicals.

The conductive material forming the conductive structure may be a metallic material, such as a transition metal compound. The transition metal may be a refractory metal, such as, without limitation, titanium, tantalum, niobium, molybdenum, hafnium, zirconium, and tungsten. In some embodiments, the conductive material may be a nitride formed by nitriding the metal. In some embodiments, other elements, e.g., carbon, may be incorporated into the conductive material, such that the conductive material may be a metal carbide, or a metal carbonitride. Non-limiting examples of such materials include tantalum nitride, tantalum carbide, tantalum carbonitride, titanium nitride, titanium carbide, and titanium carbonitride. Other non-limiting examples of materials include niobium nitride, niobium carbide, niobium carbonitride, molybdenum nitride, molybdenum carbide, molybdenum carbonitride, hafnium nitride, zirconium nitride, tungsten, and tungsten nitride.

The first layer may also be exposed to various other chemical species, e.g., oxygen, before deposition of the second layer. In some embodiments, one or more other layers of conductive material may be deposited between the first and second layers.

In some embodiments, the metal gates or gate electrodes may be formed of a first layer and a second layer of substantially similar compositions, the first and the second layers forming a single layer of a metallic material, which may be a homogeneous layer of a metallic material. In some other embodiments, the first and the second layers may be formed of different metallic materials, including different transition metal compounds. The different transition metal compounds may comprise different transition metals and/or may comprise other elements that differ between the layers. In some other embodiments, one or both of the first and the second layers may be laminate layers, formed of sublayers of different materials. For example, the laminate layers may be formed of sublayers of different transition metal compounds. In some embodiments, the first and second layers maybe formed of similar laminate layers or of different laminate layers.

It will be appreciated that high-K (HiK) Metal Gate (MG) Complementary metal-oxide-semiconductor (CMOS) technology provides an alternative to traditional poly-silicon oxynitride (poly-SiON) transistor devices in high volume production of integrated circuits. High-k dielectrics may be used to form the gate dielectrics of the transistors and metallic materials, such as the transition metal compounds noted herein, may be used to form the gate electrodes of the transistors. These high-k dielectrics and gate electrodes may be incorporated into transistor devices using various HiK-MG integrated flows, two of which include the so-called "gate-first" flow and "gate-last" flow. The latter approach may also be called Replaceable Metal Gate (RMG) and has in turn two sub-approaches: "HiK-first" and "HiK-last".

Various HiK-MG process flows are illustrated in FIGS. 1a-1c. All these HiK-MG process flows have in common a metal electrode, which is deposited on top of a HiK dielectric layer. As described in greater detail below, one difference between the flows is the timing of the occurrence of the High Thermal Budget steps (the process steps in which the substrate is exposed to elevated temperatures). A high temperature anneal, typically a Rapid Thermal Anneal (RTA), is performed to form source and drain regions. In the "gate-first" process flow, the metal electrode is deposited before and subsequently subjected to the high temperature anneal step, while in the "gate-last" flow, the metal electrode is deposited after the high temperature anneal step. Another difference between the two process flows is that for the "gate-last" flow, the requirements for high metal gate conformality is relatively higher, since in this flow, a metal electrode layer is deposited in a relatively narrow trench with a high aspect ratio (FIG. 1b).

FIGS. 1a-1c will now be described in more detail. Each illustrated structure in each process flow shows a cross-sectional view of a transistor at various times in the process flow, with time progressing from left to right. The left-most structures are the earliest-formed illustrated structures and the right-most structures are the latest-formed illustrated structures.

FIG. 1a illustrates a "gate first" process flow. In the first illustrated position, a substrate 10 is provided having an overlying gate stack formed of a silicon dioxide interface layer 20, a high-k dielectric layer 30, a dielectric cap 40 for work function tuning, a metal electrode layer 50, and a polysilicon layer 60. In the second illustrated position, side wall spacers 70 and source/drain regions 80 are subsequently formed. A Rapid Thermal Anneal for the activation and formation of the source/drain regions is indicated by 90.

FIG. 1b illustrates a "gate last" process flow in which the high-k dielectric is formed first. In the first position illustrated in FIG. 1b, a substrate 10 is provided with an overlying stack having a silicon dioxide interface layer 20, a high-k dielectric layer 30, an etch stop layer 52 and a polysilicon layer 62. In the second position illustrated in FIG. 1b), side wall spacers 70 and source/drain regions 80 are subsequently formed. The source/drain regions may be formed by a Rapid Thermal Anneal, which is indicated by 90. In the third position of FIG. 1b), the polysilicon layer 62 is removed leaving a trench 64 behind. In the fourth position of FIG. 1b) a metal electrode 54 is deposited in trench 64 and a metal fill 56 is deposited to fill the remaining volume of the trench.

FIG. 1c illustrates a "gate last" process flow in which the high-k dielectric is formed last. In the first position of FIG. 1c, a substrate 10 is provided with an overlying stack having a silicon dioxide interface layer 20 and a polysilicon layer 66. In the second position of FIG. 1c, side wall spacers 70 and source/drain regions 80 are formed. The source/drain regions may be formed by a Rapid Thermal Anneal, which is indicated by 90. In the third position of FIG. 1c, the polysilicon layer 66 is removed, leaving a trench 68. In the fourth position of FIG. 1c, a high-k dielectric layer 30 is deposited in the trench, a metal electrode layer 54 is deposited over the high-k dielectric layer 30 and a metal fill 56 is deposited to fill the remaining trench.

With reference to FIGS. 1a-1c, the silicon dioxide interface layer 20 may be formed by various processes, including deposition and/or reaction of pre-existing silicon with an oxygen species. For example, the silicon dioxide interface layer 20 may be a chemical oxide, a CVD oxide, or a thermal oxide, depending on the process flow used and the desired characteristics of the silicon dioxide interface layer.

In order to achieve target threshold voltages (Vt) for CMOS operation, metal gates with appropriate Effective Work Functions (EWF) are required. For instance, for planar High Performance (HP) CMOS logic devices, NMOS and PMOS EWF targets may be 4.2 eV and 5.1 eV, respectively. Such work function values are frequently called "band-edge" for their proximity to, respectively, the conduction and valence band edges of Si. It is believed that there are no known examples of single PMOS band-edge metallic materials, particularly metallic materials which can meet the conformality requirements of transistor devices formed using a "gate last" flow.

As an example, titanium nitride (TiN) is a commonly used metallic material for HiK-MG devices. $TiCl_4$—$NH_3$ based ALD TiN (TiN deposited using $TiCl_4$ as the Ti precursor and NH$_3$ as the N precursor in and ALD process) may be conformally deposited in the narrow trench of a RMG device in single-wafer or batch-type reactors. However, it has been found that, regardless of the deposition method and/or process conditions, the TiN's typical EWF value of 4.7-4.75 eV is below the 5.1 eV desired for low-Vt (HP) devices. Hinkle et al., ECS Transactions, 35(2) 285-295 (2011), has demonstrated that the EWF of TiN films can be increased to values above 5 eV by performing an anneal in an oxygen-containing ambient with residual or 10% O$_2$ in N$_2$ and depositing a top metal layer (cladding layer) of W. It was reported that using an aggressive anneal, by using an ambient with an O$_2$ concentration of 10% and/or an anneal temperature of 450° C. or 500°, increased EWF. However, as TiN is susceptible to oxidation, it is believed that an aggressive anneal in 10% O$_2$ in N$_2$ at 450° C. may oxidize the entire TiN layer, which is not desirable.

Advantageously, some embodiments described herein allow tuning of the EWF of a gate stack using a metal electrode or metallic bottom layer of the metal electrode without a need to expose the entire metallic layer to pronounced oxidizing conditions at temperatures of 450° C. or higher. In some embodiments, such tuning can be performed at temperatures of about 450° C. or less, about 420° C. or less, or about 400° C. or less.

In some embodiments, a first layer of a metallic material (e.g., a transition metal compound) is deposited on a substrate without exposing the substrate to an excited species, such as plasma or radicals, during the deposition. The first layer is less than about 5 nm, less than about 4 nm, less than about 3 nm, or about 1-3 nm thick in some embodiments. In some embodiments, the thickness is about 2 nm. Then, this first layer is treated. The treatment(s) include exposing the thin metallic layer to a hydrogen-containing gas, more preferably excited hydrogen-containing species, such as hydrogen-containing radicals or a hydrogen-containing plasma, whether or not in combination with an inert gas such as He or Ar. The excited species exposure may be performed at a desired temperature and plasma power for a desired time. In some embodiments, the plasma-power may be applied in pulses of 4 seconds or less. The excited species may be part of a plasma formed in the same reaction chamber as the substrate, or may be remotely generated and flowed into the reaction chamber. The hydrogen-containing gas may be, e.g., hydrogen or ammonia in some embodiments. Subsequently, a second layer of metallic material (e.g., a second transition metal compound) is deposited over the first layer of metallic material. These three steps may be performed in the same reactor or in different reactors, at the same temperature or at different temperatures.

Before and/or after the excited species exposure, an exposure of the substrate to an oxygen-containing gas may be performed or the treatment can be done without exposure to an oxygen-containing gas. Optionally, the exposure to an oxygen-containing gas can be performed in a controlled way, in a reaction chamber under desired conditions and for a desired duration. The oxygen-containing gas may be a mixture of oxygen gas and nitrogen gas in some embodiments. In some embodiments, the oxygen-containing gas may include some amounts of water vapor. The exposure to an oxygen-containing gas may be performed in-situ, in the deposition chamber using to deposit the metallic material. Alternatively, the substrate may be exposed to an oxygen-containing gas by unloading the substrate from the reaction chamber and exposing the substrate to clean room air (in a so-called "air break" step).

The first layer of metallic material may be deposited by physical vapor deposition (PVD), chemical vapor deposition (CVD), pulsed CVD or atomic layer deposition (ALD). The second layer of metallic material may be deposited by PVD, CVD, pulsed CVD or ALD, including plasma-enhanced CVD or plasma-enhanced ALD. In some embodiments, the metallic layers are deposited by ALD to achieve high step coverage. Precursors can be alternately and sequentially flowed into a reaction chamber in temporally separated pulses. In some embodiments, about a monolayer or less of a compound is formed per deposition cycle, with a sequence of one pulse of each precursor (e.g., one pulse of a titanium precursor and one pulse of a nitrogen precursor) constituting one cycle. For example, TiN can be formed using TiCl$_4$ and NH$_3$ as precursors in temporally separated pulses. As noted herein, in some embodiments, the metallic material can include tantalum nitride, tantalum carbide, tantalum nitrocarbide, titanium carbide, titanium carbonitrde, niobium nitride, niobium carbide, niobium nitrocarbide, molybdenum nitride, molybdenum carbide, molybdenum nitrocarbide, hafnium nitride, zirconium nitride, tungsten, and tungsten nitride. In some embodiments, the first and second layers may be formed of a single material. In some other embodiments, one or both of the first and second layers may be laminate layers formed of a plurality of sublayers.

As examples, the deposition of various metallic layers were investigated and the deposition sequences for forming these layers are detailed in FIGS. 2 and 4. After the treatments indicated in FIGS. 2 and 4, all samples received an anneal of 30 minutes at 420° C. in forming gas (4% H$_2$ in N$_2$). The depositions and treatments with reducing ambient were carried out in ASM International's EmerALD® single wafer reactor system for ALD, which was also provided with a plasma option that allowed a plasma to be generated in the reaction chamber. The EmerALD® single wafer reactor system is available from ASM International N.V., Almere, The Netherlands. FIGS. 2, 4, and 6 provide various details for TiN depositions. In some other embodiments, metallic materials such as tantalum nitride, tantalum carbide, tantalum carbonitride, titanium carbide, titanium carbonitride, niobium nitride, niobium carbide, niobium carbonitride, molybdenum nitride, molybdenum carbide, molybdenum carbonitride, hafnium nitride, zirconium nitride, tungsten, and tungsten nitride are formed in combination with or instead of TiN using similar process steps and conditions to achieve similar results.

Deposition according to embodiments disclosed herein was found to provide an increase in EWF. The effective work function (EWF) values and equivalent oxide thickness (EOT) values were extracted from C-V measurements on MIS structures. The metal electrodes were deposited on top of layers of 2 nm HfO$_2$ and 1 nm interfacial SiO$_2$ on silicon substrates. With reference to FIG. 2, all TiN depositions were carried out at 390° C., and air breaks were applied both between the first TiN layer deposition and the film treatment step, and between the treatment step and the second TiN layer deposition step. A single 10 nm thick ALD TiN layer typically gives a work function of about 4.7-4.75 eV (1F). However, deposition according to embodiments disclosed herein resulted in a higher EWF. For example, a 2 nm ALD TiN layer, followed by an air break, a H$_2$/Ar plasma treatment (32 pulses of 2 s each), a second air break and a 10 nm ALD TiN layer exhibited an exceptionally high EWF of 4.96 eV (1F).

The increase in EWF could be attributed to exposure to excited hydrogen species. With reference to FIG. 3, it was found that by growing a thin TaCN layer by 32 cycles of plasma-enhanced ALD (PEALD) between the bottom and top ALD TiN layers, even higher EWF values of 4.98 eV (1C) or 5.04 eV (1B) were achieved. Replacing the PEALD TaCN layer by a thermal ALD TaCN layer resulted in a lower work function, close to that of a single 10 nm ALD TiN layer (1D and 1E). These results indicate that the higher EWF obtained with PEALD TaCN can be attributed to the exposure of the bottom (first) TiN layer to the $Ar/H_2$-containing plasma ignited during the PEALD TaCN deposition. It was also found that increased duration of plasma pulses from 2 to 3 or 4 s leads to increased EWF at an increased effective oxide thickness (EOT). Finally, it was observed that applying only air breaks between a first 2 nm TiN layer and a second thicker TiN layer, without applying a plasma treatment step (1G), does not result in the EWF increase.

It was also found that, using processes similar to that described above for TiN layers, the work function of TiN/TaCN bilayers and TaC layers could be increased. The TiN/TaCN bilayers and the TaC layers were deposited by a thermally activated process without radicals generated by a plasma, followed by treatment of the layers in a hydrogen-containing gas, which included exposing the layers to hydrogen radicals or to a hydrogen-containing plasma. The work function could also be increased by exposing the layers to thermally activated hydrogen-containing gas.

In other experiments, the results of which are presented in FIG. 4, the influence of the following parameters was also investigated:
  effects of the number of air breaks and their positions:
    before and after $Ar/H_2$ plasma treatment;
    before $Ar/H_2$ plasma treatment;
    after $Ar/H_2$ plasma treatment; and
    no air break;
  effects of TiN deposition temperature (325° C. vs. 390° C.); and
  effects of wafer temperature during $Ar/H_2$ plasma treatment (325° C. vs. 390° C.).
The $Ar/H_2$ plasma was applied pulse-wise, in 32 pulses of 2 s each.

Figure 5:
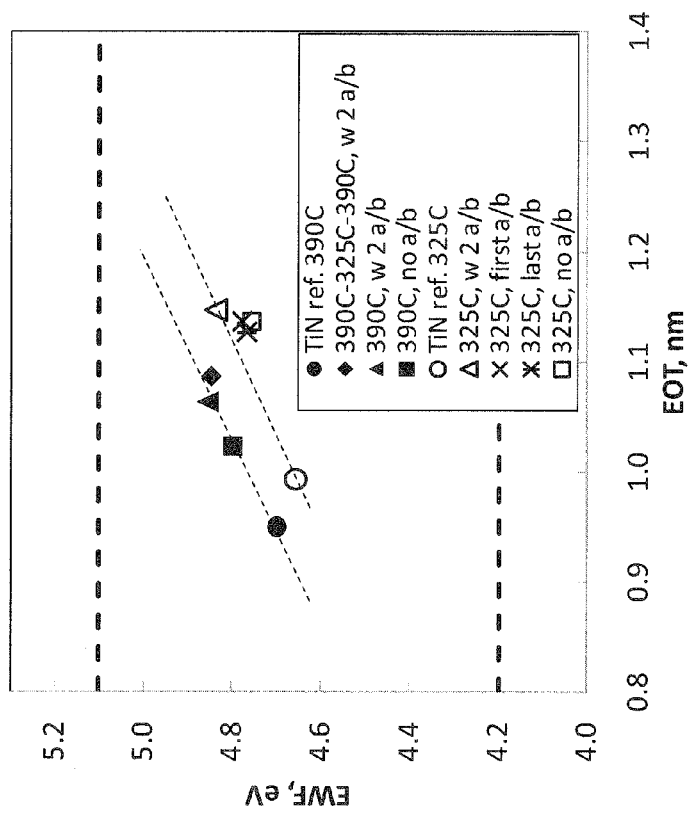
FIG. 5 is an example of a graphical presentation of the results of sequences shown in FIG. 4.

As can be observed in FIG. 5, the 325° C. deposition temperature for the TiN films resulted in systematically higher EOT values. It was found that an advantageous EWF/EOT trade-off may be achieved with the following sequence (FIG. 4: 2C):
  Both first and second TiN layers grown at 390° C.;
  $Ar/H_2$ plasma treatment performed at 390° C.; and
  Two air breaks (before and after $Ar/H_2$ plasma treatment).
It will be appreciated that differences exist between some results in FIG. 2 and FIG. 4 for samples processed at similar conditions (FIG. 2, 1F vs. FIG. 4, 2B). These variations may be due to a time lapse between the experiments of FIG. 2 and FIG. 4. Furthermore, the air break in the experiments of FIG. 4 was shorter (1-2 days) than the air break for the experiments of FIG. 2 (1-2 weeks). Nevertheless, for each set of experiments, all sequences having exposure to $Ar/H_2$ plasma provided an increase in EWF over the references from those sets (FIG. 2: 1A, 1G; FIG. 4: 2A, 2E) having no such exposure.

Various additional process conditions used in the experiments detailed in FIGS. 2 and 4 are summarized in FIG. 6. It will be appreciated that TBTDET is TertiaryButylimido Tris (DiEthylamino)Tantalum, $Ta[N(C_2H_5)_2]_3[=NC(CH_3)_3]$. It is believed that at different temperatures and with fewer (or no) air breaks, the desired high EWF may be achieved by adjusting various treatment parameters. Some examples of process parameters which may be varied include, but are not limited to: 1) varying bottom TiN layer thickness; 2) varying plasma power and time, including thermal only treatments (without plasma); and 3) varying $O_2$, $N_2$, and $H_2$ content in the reactor. In the experiments discussed above, an EWF/EOT trend line was observed: higher EWF is observed at higher EOT values. On the other hand, for some applications, it is desired to achieve high EWF at low EOT values. It is believed that the variation of the above-noted parameters may allow an advantageous trade-off between high EWF and low EOT.

Without being limited by theory, it is believe that an air break in combination with exposure to a hydrogen-containing gas can also influence EWF. For example, it is believe that an air break followed by $H_2/Ar$ plasma treatment, followed by another air break, changes the grain size/morphology and/or O and N content of the metallic material-containing stack and, as a result, the EWF of the stack (e.g., a TiN stack) can be increased. Further, the air break may result in the presence of oxygen or hydrogen-containing impurities (e.g., $O_2$ or $H_2O$) during the step of exposing the first metallic layer to a hydrogen-containing gas or a hydrogen-containing plasma. These impurities may play a role in achieving desired stack properties.

For example, without wanting to be limited by theory, it is believed that some increases in the EWF may be a result of the formation of H—O dipoles on the interface between the first metal layer and the subsequent metal layer. A low concentration of oxygen may be provided and can originate from the residual oxygen present in the reactor and/or in the first metal layer, or from intentional exposure of the first metal layer to oxygen prior to, during or after the hydrogen radical or plasma treatment. The oxygen can originate from the air breaks before and/or after the hydrogen treatment. Preferably, the oxygen concentration is maintained at a sufficiently low level to limit oxidation of the metal layers, which can result in an increase in the EOT, which is undesirable.

Figure 7:
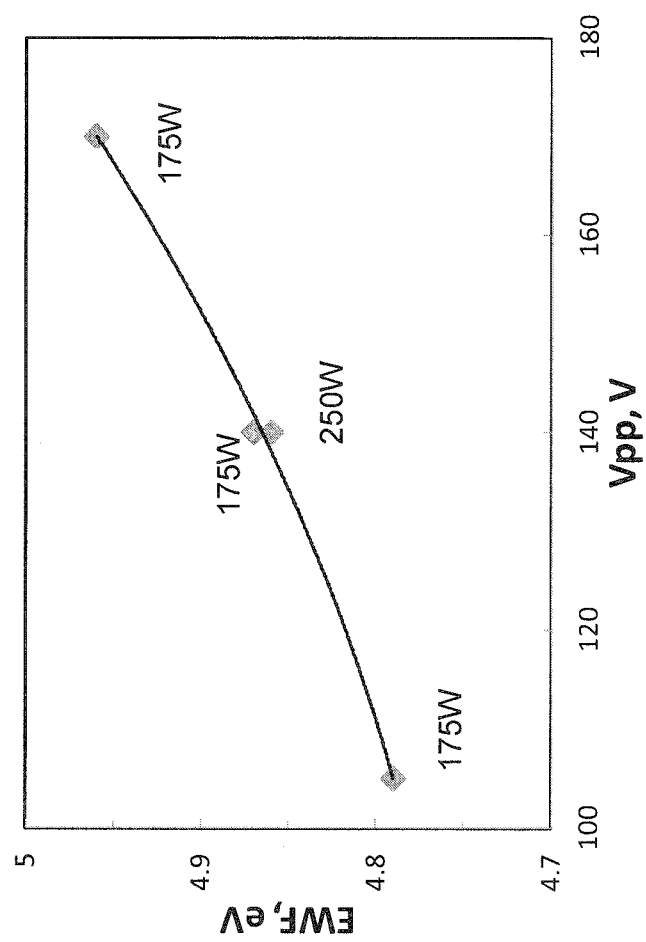
FIG. 7 is an example of a graphical presentation of changes in effective work function as the peak-to-peak voltage for generating excited hydrogen-containing species is changed.
Figure 8:
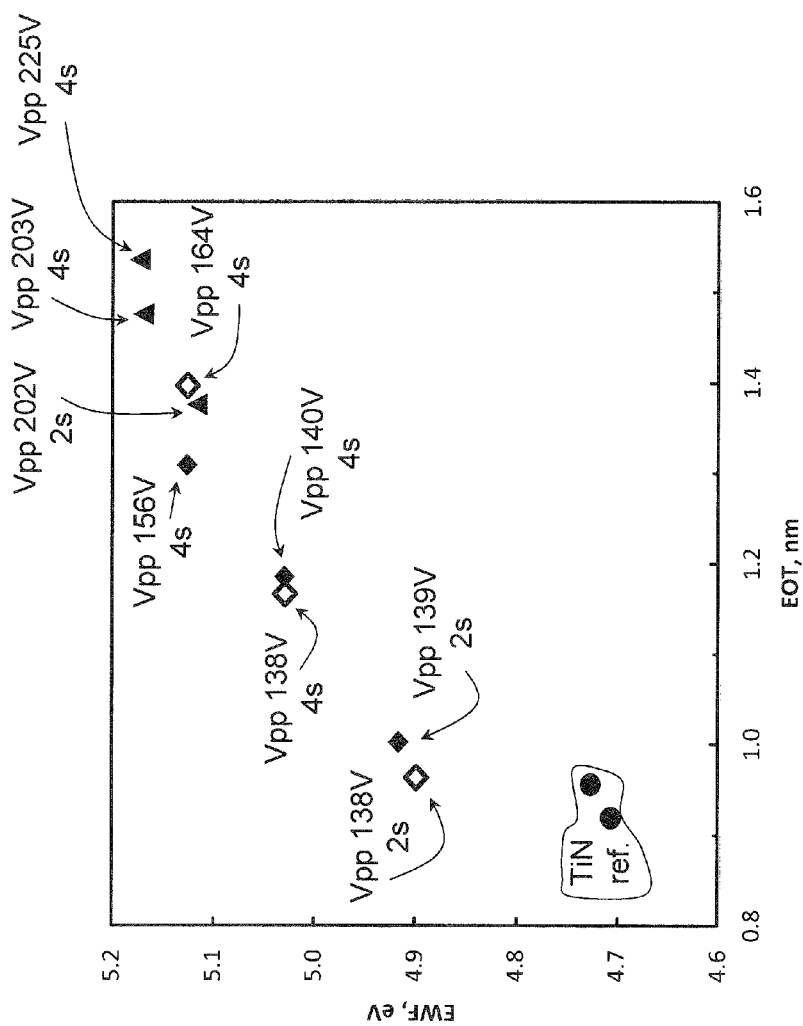
FIG. 8 is an example of a graphical presentation of changes in effective work function as the peak-to-peak voltage for generating excited hydrogen-containing species is changed along with changes in the duration of the power applied for generating each pulse of the excited hydrogen-containing species.

In FIG. 7 it is shown that Vpp (peak-to-peak Voltage) during the plasma treatment is a more determining factor and shows better correlation with the EWF than the plasma power: a higher EWF is obtained for a higher Vpp. Further results are shown in FIG. 8 for TiN films deposited at 390° C. A first TiN film of 2 nm thickness was deposited, then 32 pulses of plasma exposure were applied with the Vpp and pulse duration as indicated in FIG. 8, and then a second TiN film of 10 nm thickness was deposited. Air breaks were applied before and after the hydrogen plasma treatment. The hydrogen plasma treatment was applied with a hydrogen/Ar mixture at 0.5 Torr. From FIG. 8 it can be observed that a higher Vpp and/or a longer pulse duration result in a higher EWF. In some embodiments, the Vpp can be about 110 V or higher, about 130 V or higher, about 160 V or higher, or about 200 V or higher. In some embodiments, the duration of the exposure to the excited hydrogen species can be about 2 second or more, about 4 seconds or more, or about 2-4 seconds. As a reference, TiN formed without exposure to the plasma, as noted above, had a lower EWF of about 4.7 or 4.73.

With reference again to FIGS. 1b-1c, it will be appreciated that, in some embodiments, the metallic material formed by deposition of first and second layers may be utilized as the electrode 54. Thus, in some embodiments the deposition of the first and second layers may be performed in a narrow trench defining by spacers formed of dielectric material, and a metal fill may subsequently be deposited in an opening defined by the gate electrode 54.

Some examples of the deposition of metal electrode stacks in a CMOS process flow are provided below with reference to FIGS. 9a-12. Similar hatching and shading refer to similar layers throughout. The process flows include the deposition of a PMOS metal electrode having a high work function and an NMOS metal electrode having a low work function. It will be appreciated that the materials discussed below are examples and that other materials may also be used. For example, various other metallic materials, as discussed herein, may be used in place of TiN.

EXAMPLE 1

Example 1 will be discussed with reference to FIGS. 9*a*-9*c*. The gate dielectric may include $HfO_2$. From bottom to top, the PMOS metal electrode is formed by deposition of a 2 nm TiN layer, a 1 nm TaCN layer, a 4 nm TiN layer, a 5 nm TiAl layer and a layer of fill metal. The NMOS metal electrode includes, from bottom to top, a 2 nm TiN layer, a 1 nm TaCN layer, a 5 nm TiAl layer, and a layer of fill metal. TiAl provides a low work function for NMOS. In the PMOS stack, however, the TiAl layer is remote from the $HfO_2$/metal electrode interface and has limited influence on the PMOS stack work function at that $HfO_2$/metal electrode interface. The treatment with Ar/H* (where H* indicates an excited-hydrogen containing species, such as hydrogen radicals in a plasma) in the PMOS stack can be applied before the TaCN layer deposition (FIGS. 9*a* and 9*b*), during the TaCN deposition if a plasma enhanced deposition process is used to form the TaCN layer (FIG. 9*c*), or after the TaCN layer deposition (FIG. 9*d*).

Figure 9A:
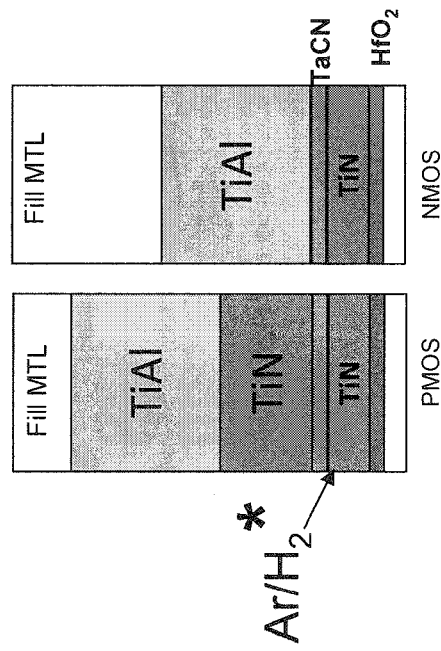
FIGS. 9a-12 show examples of schematic cross-sectional views of gate electrode stacks.

The stacks of FIG. 9*a* can be produced using the following process flow:
1. Deposition of a first TiN layer;
2. Treatment of the first TiN layer in hydrogen-containing gas;
3. Deposition of a TaCN layer by thermal process and deposition of a second TiN layer;
4. Lithography and etch to remove the second TiN layer from NMOS devices, with etch stop on TaCN layer; and
5. Deposition of a TiAl layer and fill metal.

Figure 9B:
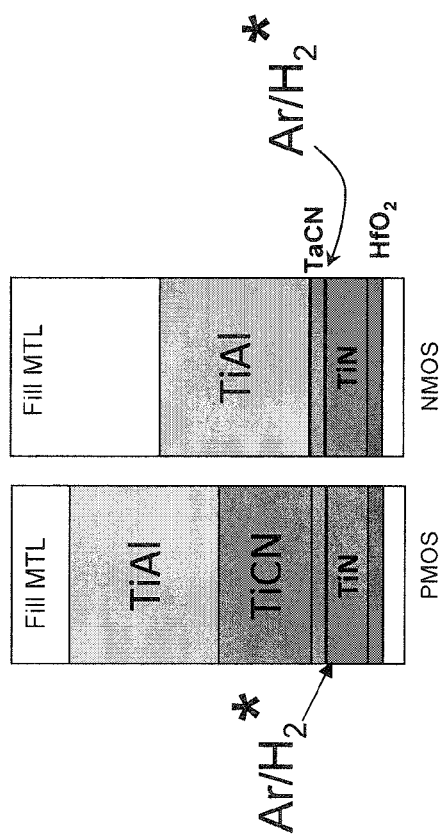

The stacks of FIG. 9*b* can be produced using the following process flow:
1. Deposition of a TiN layer;
2. Lithography and etch to form a protection layer (e.g., a photoresist or $SiO_2$ layer) on NMOS devices;
3. Treatment of the TiN layer in a hydrogen-containing gas;
4. Removal of the protection layer;
5. Deposition of a TaCN layer by thermal process and deposition of a second TiN layer;
6. Lithography and etch to remove the second TiN layer from NMOS devices, with etch stop on TaCN layer; and
7. Deposition of a TiAl layer and fill metal.

Figure 9C:
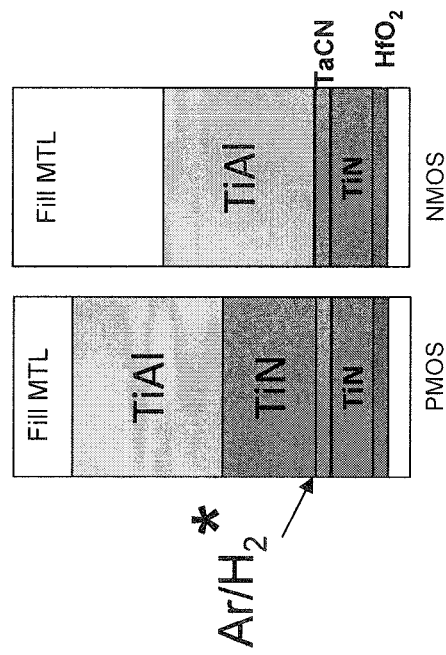
Figure 9D:
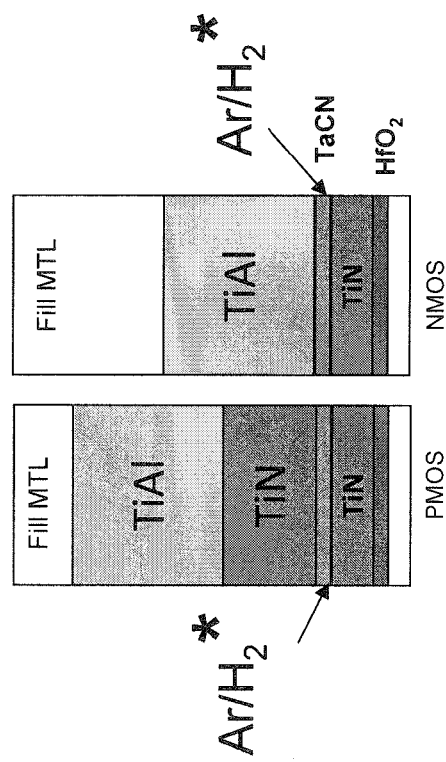

The stacks of FIG. 9C can be produced with the following process flow:
1. Deposition of a first TiN layer;
2. Deposition of a TaCN layer by a hydrogen-containing plasma enhanced process;
3. Deposition of a second TiN layer;
4. Lithographty and etch to remove the second TiN layer from NMOS devices, with etch stop on TaCN layer; and
5. Deposition of a TiAl layer and fill metal.

The stacks of FIG. 9*d* can be deposited with the following process flow:
1. Deposition of a first TiN layer and the TaCN layer;
2. Lithography and etch to form a protection layer (e.g. a photoresist or SiO2 layer) on NMOS devices;
3. Treatment in a hydrogen-containing gas;
4. Removal of the protection layer;
5. Deposition of a second TiN layer;
6. Lithography and etch to remove the second TiN layer from NMOS devices, with etch stop on TaCN;
7. (Optional etch to trim down thickness of remaining TaCN layer);
8. Deposition of a TiAl layer (nEWF) and a fill metal optionally with deposition of thin barrier metal layer (e.g. TiN layer) before fill metal.

EXAMPLE 2

Figure 10:
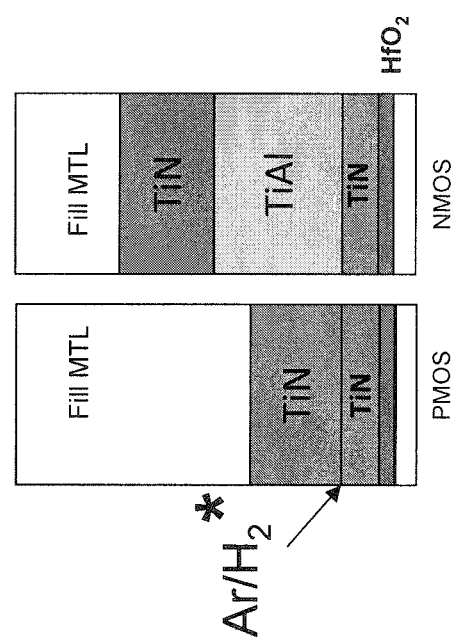

Example 2 will be discussed with reference to FIG. 10. The gate dielectric layer may include $HfO_2$. The PMOS metal electrode is formed by deposition of a 2 nm TiN layer, treatment of the TiN layer by a hydrogen containing gas, deposition of a 4 nm TiN layer, and deposition of a fill metal. The NMOS metal electrode includes a first 2 nm TiN layer, a 5 nm TiAl layer, a 4 nm second TiN layer and a fill metal layer. The stacks of FIG. 10 can be produced using the following process flow:
1. Deposition of a first TiN layer and a TiAl layer;
2. Lithography and etch to form a protection layer (e.g. a photo resist layer or $SiO_2$ layer) on NMOS devices;
3. Remove the TiAl layer from PMOS devices, with etch stop on the TiN layer;
4. Treatment in a hydrogen-containing gas;
5. Removal of the protection layer; and
6. Deposition of a second TiN layer and a fill metal.

EXAMPLE 3

Figure 11:
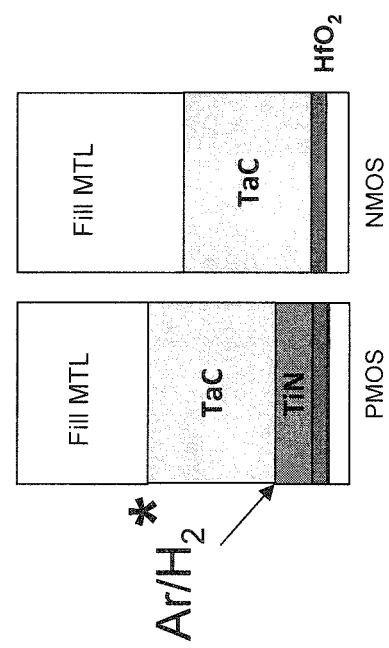

Example 3 will be discussed with reference to FIG. 11. The PMOS electrode is formed by deposition of a 2 nm TiN layer, treatment of the TiN layer in a hydrogen-containing gas, deposition of a 5 nm TaC layer, and deposition of a fill metal layer. The NMOS stack may include a 5 nm TaC layer, and a layer of fill metal. TaC also provides a low work function, suitable for NMOS devices, and comparable to TiAl. However, TaC has the advantage that it can be deposited by ALD whereas TiA1 is typically formed by a PVD process. The stacks of FIG. 11 can be produced by the following process sequence:
1. Deposition of a first TiN layer;
2. Treatment in a hydrogen-containing gas;
3. Lithography and etch (optionally, with a $SiO_2$ hardmask) to remove TiN from NMOS devices, with etch stop on $HfO_2$;
4. (Optional hardmask removal, if applicable);
5. Deposition of a TaC layer to set EWF of NMOS devices; and
6. Deposition of fill metal.

EXAMPLE 4

Figure 12:
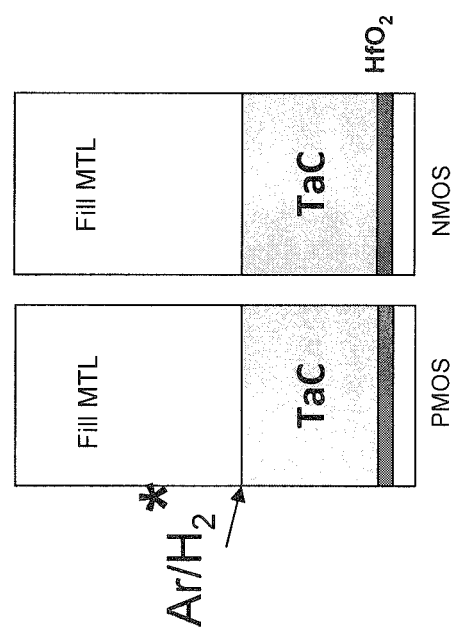

Example 4 will be discussed with reference to FIG. 12. The PMOS metal electrode is formed by deposition of a 5 nm TaC layer, treatment in a hydrogen-containing gas, and deposition of a metal fill layer. The NMOS metal electrode includes a 5 nm TaC layer and the fill metal, the only difference being that for the NMOS metal electrode, the treatment in hydrogen-containing gas is omitted. It is contemplated that with the treatment in hydrogen-containing gas alone the work function of the TaC layer may be changed sufficiently to achieve suitable work functions for the PMOS and the NMOS devices. The stacks of FIG. 12 can be produced using the following process flow:
1. Deposition of a TaC layer (with nEWF);
2. Lithography and etch to mask NMOS devices with a protection layer (e.g. a photoresist layer or $SiO_2$ layer);
3. Treatment in hydrogen-containing gas to adjust EWF for PMOS devices;

4. Removal of the protection layer from NMOS devices; and
5. Deposition of a fill metal.

For all Examples 1 through 4, shown in FIGS. 9a-12, t a thin barrier layer, e.g. a 2 nm TiN layer, may additionally be deposited before deposition of the fill metal layer. Without be limited by theory, it is believe that such a barrier layer can protect the work function sensitive layers against in-diffusion of impurities from the fill metal.

The processes described herein may be used to adjust the Effective Work Function of PMOS and NMOS devices simultaneously. In addition, different groups of devices having different work functions may be formed. It will be appreciated that different work functions can provide different threshold voltages for transistor devices. Consequently, in some embodiments, it is possible to form a group of devices having low Vt resulting in high speed and high power consumption (Vt=threshold Voltage), a group having medium Vt resulting in medium speed and medium power consumption and a group having high Vt resulting in low speed and low power consumption, all groups being formed on the same substrate by a process flow. The different groups may be exposed to different hydrogen treatments in accordance with processes discussed herein, or different stacks according to the processes discussed herein may be formed for each group. For example, the electrode layers for the various groups may be deposited simultaneously, and one or more groups may be protected with protective layers while one or more other groups are exposed to treatment with a hydrogen-containing gas, as discuss herein. Subsequently, the exposed groups may be protected and the protective layer may be removed from one or more of the other groups to allow those other groups to be treated with a hydrogen-containing gas. This process may be repeated until all groups are exposed to hydrogen-containing gas as desired. The exposure parameters for each group can vary, thereby allowing different threshold voltages to be established for different groups.

In some other implementations, the electrode stacks for different groups are separately formed. Different threshold voltages are provided by providing different conditions for exposure to hydrogen-containing gas during the formation of each stack.

It will be appreciated by those skilled in the art that various omissions, additions and modifications can be made to the processes described above without departing from the scope of the invention, and all such modifications and changes are intended to fall within the scope of the invention, as defined by the appended claims.

What is claimed is:

1. A process for semiconductor processing, comprising:
    forming a gate electrode comprising a first and a second layer over a substrate, wherein forming the gate electrode comprises:
    providing the substrate in a reaction chamber, the substrate comprising a gate dielectric;
    depositing the first layer comprising a transition metal compound on the gate dielectric, wherein depositing the first layer is performed without exposing the substrate to plasma or plasma-generated radicals;
    increasing a work function of the gate electrode by 0.1 eV to 0.5 eV, wherein increasing the work function comprises:
    exposing the first layer to hydrogen-containing species, wherein exposing the first layer to the hydrogen-containing species comprises:
    flowing gas into the reaction chamber, the gas selected from the group consisting of: hydrogen-containing gas, and hydrogen-containing gas with at least one inert carrier gas, and forming an in-situ plasma inside the reaction chamber with the gas, thereby exposing the first layer to the in-situ plasma; or
    flowing gas into a remote plasma generator to form a remote plasma, the gas selected from the group consisting of: hydrogen-containing gas, and hydrogen-containing gas with at least one inert carrier gas, and flowing the remote plasma into the reaction chamber, thereby exposing the first layer to the remote plasma; and
    subsequently depositing the second layer comprising a transition metal compound,
    wherein the gate electrode and the gate dielectric constitute a gate stack,
    wherein a peak-to-peak voltage for generating the in-situ plasma or the remote plasma is 110 V or higher, and
    wherein, between depositing the first layer and subsequently depositing the second layer, oxygen plasma is not flowed into the reaction chamber loaded with the substrate and oxygen gas is not flowed into the reaction chamber loaded with the substrate.

2. The process of claim 1, wherein a thickness of the first layer is 5 nm or less.

3. The process of claim 1, wherein the gate electrode has an increased work function of 5.0 eV or higher after increasing the work function of the gate electrode.

4. The process of claim 1, wherein the hydrogen-containing species comprises hydrogen radicals.

5. The process of claim 1, wherein a plasma power for forming the in-situ plasma or the remote plasma is 175 W or more.

6. The process of claim 1, wherein a plasma power for generating the in-situ plasma or the remote plasma is applied in pulses of 2 seconds or more.

7. The process of claim 1, wherein a peak-to-peak voltage for generating the in-situ plasma or the remote plasma is 130 V or higher.

8. The process of claim 7, wherein the peak to peak voltage is 160V or higher.

9. The process of claim 1, wherein exposing the first layer to the hydrogen-containing species comprises depositing a film by plasma-enhanced atomic layer deposition.

10. The process of claim 9, wherein the film deposited by plasma-enhanced atomic layer deposition is a tantalum-containing film.

11. The process of claim 1, wherein the first layer is deposited by atomic layer deposition.

12. The process of claim 11, wherein the second layer is deposited by plasma-enhanced atomic layer deposition.

13. The process of claim 1, wherein the second layer is deposited by atomic layer deposition.

14. The process of claim 1, further comprising exposing the substrate to an oxygen-containing gas between depositing the first layer and the exposing the first layer, or between the exposing the first layer and depositing the second layer.

15. The process of claim 14, wherein exposing the substrate to an oxygen-containing gas comprises unloading the substrate from the reaction chamber and exposing the substrate to cleanroom air.

16. The process of claim 1, further comprising exposing the substrate to an oxygen-containing gas between depositing the first layer and the exposing the first layer, and between the exposing the first layer and depositing the second layer.

17. The process of claim 1, wherein forming the gate electrode comprises depositing the first and second layers into a trench defined by dielectric material.

18. The process of claim 17, wherein forming the gate electrode comprises forming the gate electrode of a PMOS transistor.

19. The process of claim 17, wherein forming the gate electrode defines an opening in the trench, further comprising filling the opening with a metal.

20. The process of claim 19, wherein the substrate is maintained at temperatures of less than 420° C. between depositing the first layer and filling the opening.

21. The process of claim 1, wherein one or both of the first and second layers is a laminate layer comprising a plurality of sublayers of material.

22. A process for semiconductor processing, comprising:
depositing a metallic electrode on a substrate within a reaction chamber, wherein depositing the metallic electrode comprises:
depositing metallic material on a dielectric layer, wherein precursors for depositing the metallic material are not plasma-activated;
increasing a work function of the metallic electrode by 0.1 eV to 0.5 eV, wherein increasing the work function comprises:
exposing the metallic material to excited hydrogen-containing species, wherein exposing the metallic material to the excited hydrogen-containing species comprises:
flowing gas into the reaction chamber, the gas selected from the group consisting of: hydrogen-containing gas, and hydrogen-containing gas with at least one inert carrier gas, and forming an in-situ plasma inside the reaction chamber with the gas, thereby exposing the metallic material to the in-situ plasma; or
flowing gas into a remote plasma generator to form a remote plasma, the gas selected from the group consisting of: hydrogen-containing gas, and hydrogen-containing gas with at least one inert carrier gas, and flowing the remote plasma into the reaction chamber, thereby exposing the metallic material to the remote plasma; and
subsequently depositing additional metallic material on the metallic material after exposing the metallic material,
wherein the metallic electrode and the dielectric layer constitute a gate stack,
wherein a peak-to-peak voltage for generating the in-situ plasma or the remote plasma is 110 V or higher, and
wherein, between depositing the metallic material and subsequently depositing the additional metallic material, oxygen plasma is not flowed into the reaction chamber loaded with the substrate and oxygen gas is not flowed into the reaction chamber loaded with the substrate.

23. The process of claim 22, wherein precursors for depositing the additional metallic material are not plasma-activated.

24. The process of claim 22, wherein depositing the metallic electrode is performed at less than 420° C.

25. The process of claim 22, wherein the metallic material is a transition metal compound.

26. The process of claim 25, wherein the transition metal compound is a metal nitride, a metal carbide, or a metal nitrocarbide.

27. The process of claim 26, wherein the transition metal compound is chosen from the group consisting of tantalum carbide, tantalum nitrocarbide, tantalum nitride, titanium carbide, titanium carbonitrde, and titanium nitride.

28. The process of claim 22, wherein depositing metallic material forms a homogenous layer of material.

29. The process of claim 22, wherein depositing metallic material forms a laminate layer comprising sublayers of different materials.

30. The process of claim 22, wherein depositing metallic material and depositing additional metallic material comprises depositing a same material.

31. The process of claim 22, wherein depositing metallic material forms a layer having a thickness of 1-3 nm.

32. The process of claim 31, wherein a work function of the metal electrode in the gate stack is increased more than 0.15 eV compared to performing a process without a plasma treatment including the excited hydrogen-containing species.

33. The process of claim 1, wherein the gate electrode has an increased work function of 4.9 eV or higher after increasing the work function of the gate electrode.

34. The process of claim 22, wherein the metallic electrode has an increased work function of 4.9 eV or higher after increasing the work function of the metallic electrode.

35. A process for semiconductor processing, comprising:
forming a gate electrode comprising a first and a second layer over a substrate, wherein forming the gate electrode comprises:
providing the substrate in a reaction chamber, the substrate comprising a gate dielectric;
depositing the first layer comprising a transition metal compound on the gate dielectric, wherein depositing the first layer is performed without exposing the substrate to plasma or plasma-generated radicals;
increasing a work function of the gate electrode by 0.1 eV to 0.5 eV, wherein increasing the work function comprises:
exposing the first layer to hydrogen-containing species, wherein exposing the first layer to the hydrogen-containing species comprises:
flowing gas into the reaction chamber, the gas selected from the group consisting of: hydrogen-containing gas, and hydrogen-containing gas with at least one inert carrier gas, and forming an in-situ plasma inside the reaction chamber with the gas, thereby exposing the first layer to the in-situ plasma; or
flowing gas into a remote plasma generator to form a remote plasma, the gas selected from the group consisting of: hydrogen-containing gas, and hydrogen-containing gas with at least one inert carrier gas, and flowing the remote plasma into the reaction chamber, thereby exposing the first layer to the remote plasma; and
subsequently depositing the second layer comprising a transition metal compound,
wherein the gate electrode and the gate dielectric constitute a gate stack,
wherein a plasma power for forming the in-situ plasma or the remote plasma is 175 W or more, and
wherein, between depositing the first layer and subsequently depositing the second layer, oxygen plasma is not flowed into the reaction chamber loaded with the substrate and oxygen gas is not flowed into the reaction chamber loaded with the substrate.

36. A process for semiconductor processing, comprising:
forming a gate electrode comprising a first and a second layer over a substrate, wherein forming the gate electrode comprises:
providing the substrate in a reaction chamber, the substrate comprising a gate dielectric;
depositing the first layer comprising a transition metal compound on the gate dielectric, wherein depositing the first layer is performed without exposing the substrate to plasma or plasma-generated radicals;

increasing a work function of the gate electrode by 0.1 eV to 0.5 eV, wherein increasing the work function comprises:

exposing the first layer to hydrogen-containing species, wherein exposing the first layer to the hydrogen-containing species comprises:

flowing gas into the reaction chamber, the gas selected from the group consisting of: hydrogen-containing gas, and hydrogen-containing gas with at least one inert carrier gas, and forming an in-situ plasma inside the reaction chamber with the gas, thereby exposing the first layer to the in-situ plasma; or flowing gas into a remote plasma generator to form a remote plasma, the gas selected from the group consisting of: hydrogen-containing gas, and hydrogen-containing gas with at least one inert carrier gas, and flowing the remote plasma into the reaction chamber, thereby exposing the first layer to the remote plasma; and subsequently depositing the second layer comprising a transition metal compound, wherein the gate electrode and the gate dielectric constitute a gate stack, wherein a plasma power for generating the in-situ plasma or the remote plasma is applied in pulses of 2 seconds or more, and wherein, between depositing the first layer and subsequently depositing the second layer, oxygen plasma is not flowed into the reaction chamber loaded with the substrate and oxygen gas is not flowed into the reaction chamber loaded with the substrate.

37. A process for semiconductor processing, comprising:

depositing a metallic electrode on a substrate within a reaction chamber, wherein depositing the metallic electrode comprises:

depositing metallic material on a dielectric layer, wherein precursors for depositing the metallic material are not plasma-activated;

increasing a work function of the metallic electrode by 0.1 eV to 0.5 eV, wherein increasing the work function comprises:

exposing the metallic material to excited hydrogen-containing species, wherein exposing the metallic material to the excited hydrogen-containing species comprises:

flowing gas into the reaction chamber, the gas selected from the group consisting of: hydrogen-containing gas, and hydrogen-containing gas with at least one inert carrier gas, and forming an in-situ plasma inside the reaction chamber with the gas, thereby exposing the metallic material to the in-situ plasma; or flowing gas into a remote plasma generator to form a remote plasma, the gas selected from the group consisting of: hydrogen-containing gas, and hydrogen-containing gas with at least one inert carrier gas, and flowing the remote plasma into the reaction chamber, thereby exposing the metallic material to the remote plasma; and subsequently depositing additional metallic material on the metallic material after exposing the metallic material, wherein the metallic electrode and the dielectric layer constitute a gate stack, wherein a plasma power for forming the in-situ plasma or the remote plasma is 175 W or more, and wherein, between depositing the metallic material and subsequently depositing the additional metallic material, oxygen plasma is not flowed into the reaction chamber loaded with the substrate and oxygen gas is not flowed into the reaction chamber loaded with the substrate.

38. A process for semiconductor processing, comprising:

depositing a metallic electrode on a substrate within a reaction chamber, wherein depositing the metallic electrode comprises:

depositing metallic material on a dielectric layer, wherein precursors for depositing the metallic material are not plasma-activated;

increasing a work function of the metallic electrode by 0.1 eV to 0.5 eV, wherein increasing the work function comprises:

exposing the metallic material to excited hydrogen-containing species, wherein exposing the metallic material to the excited hydrogen-containing species comprises:

flowing gas into the reaction chamber, the gas selected from the group consisting of: hydrogen-containing gas, and hydrogen-containing gas with at least one inert carrier gas, and forming an in-situ plasma inside the reaction chamber with the gas, thereby exposing the metallic material to the in-situ plasma; or flowing gas into a remote plasma generator to form a remote plasma, the gas selected from the group consisting of: hydrogen-containing gas, and hydrogen-containing gas with at least one inert carrier gas, and flowing the remote plasma into the reaction chamber, thereby exposing the metallic material to the remote plasma; and subsequently depositing additional metallic material on the metallic material after exposing the metallic material, wherein the metallic electrode and the dielectric layer constitute a gate stack, wherein a plasma power for generating the in-situ plasma or the remote plasma is applied in pulses of 2 seconds or more, and wherein, between depositing the metallic material and subsequently depositing the additional metallic material, oxygen plasma is not flowed into the reaction chamber loaded with the substrate and oxygen gas is not flowed into the reaction chamber loaded with the substrate.

* * * * *

UNITED STATES PATENT AND TRADEMARK OFFICE
CERTIFICATE OF CORRECTION

PATENT NO.        : 9,136,180 B2
APPLICATION NO.   : 13/359385
DATED             : September 15, 2015
INVENTOR(S)       : Vladimir Machkaoutsan It is certified that error appears in the above-identified patent and that said Letters Patent is hereby corrected as shown below:

In The Specification

In column 6 at line 18, Change "carbonitrde," to --carbonitride,--.

In column 9 at line 53, Change "Lithographty" to --Lithography--.

In column 9 at line 60, Change "SiO2" to --$SiO_2$--.

In The Claims

In column 12 at line 39, In Claim 8, change "peak to peak" to --peak-to-peak--.

In column 13 at line 65, In Claim 27, change "carbonitrde," to --carbonitride,--.

Signed and Sealed this
Twenty-third Day of August, 2016

Michelle K. Lee
*Director of the United States Patent and Trademark Office*